United States Patent [19]
Dixon et al.

[11] Patent Number: 5,188,547
[45] Date of Patent: Feb. 23, 1993

[54] ELECTRICAL TERMINAL PIN

[75] Inventors: Daniel A. Dixon, Naperville; Frederick J. Gierut, Tinley Park; Joe Lawniczak, Schaumburg; Arvind Patel, Naperville; Michael Primorac, Chicago, all of Ill.

[73] Assignee: Molex Incorporated, Lisle, Ill.

[21] Appl. No.: 879,637

[22] Filed: May 7, 1992

[51] Int. Cl.[5] ............................................. H01R 13/02
[52] U.S. Cl. .................................. 439/886; 439/884; 439/887
[58] Field of Search ................ 439/78, 81, 82, 884, 439/886, 887

[56] References Cited

U.S. PATENT DOCUMENTS

| | | | |
|---|---|---|---|
| 4,983,134 | 1/1991 | Baldyrou | 439/884 |
| 5,015,207 | 5/1991 | Koepke | 439/886 |
| 5,083,928 | 1/1992 | Aikens et al. | 439/82 |
| 5,122,075 | 6/1992 | Kile | 439/329 |

FOREIGN PATENT DOCUMENTS

| | | | |
|---|---|---|---|
| 3305928 | 8/1984 | Fed. Rep. of Germany | 439/887 |
| 3932535 | 7/1990 | Fed. Rep. of Germany | 439/886 |
| 2239580 | 7/1981 | Japan | . |
| 0232983 | 9/1990 | Japan | 439/886 |

OTHER PUBLICATIONS

Keith W. Lebo, Connection Technology, "Swaging Instead of Stamping for Contacts", Apr. 1989, pp. 25 and 26.

Primary Examiner—Paula A. Bradley
Attorney, Agent, or Firm—Stephen Z. Weiss

[57] ABSTRACT

An electrical terminal pin is provided with a pin tip for insertion into a mating electrical female terminal, a hole in a printed circuit board or the like. The pin has an electrically conductive core plated with an electrically conductive layer. The pin tip is formed of a generally rounded pyramidal configuration defining four slightly curved convex sides joined at four edges converging at a pin end. Two opposite sides of the pin tip are non-plated. The other two opposite sides of the pin tip are plated with the conductive layer. Portions of the conductive plating layer overlap the edges of the pin tip in a smooth or rounded configuration to eliminate any sharpness thereof and to provide additional plated areas over the exposed core material. The pin tip is formed by a cutting and coining operation to form the configuration of the tip and to coin the overlapping portions of the conductive plating layer over the sharp edges of the pin tip.

4 Claims, 3 Drawing Sheets

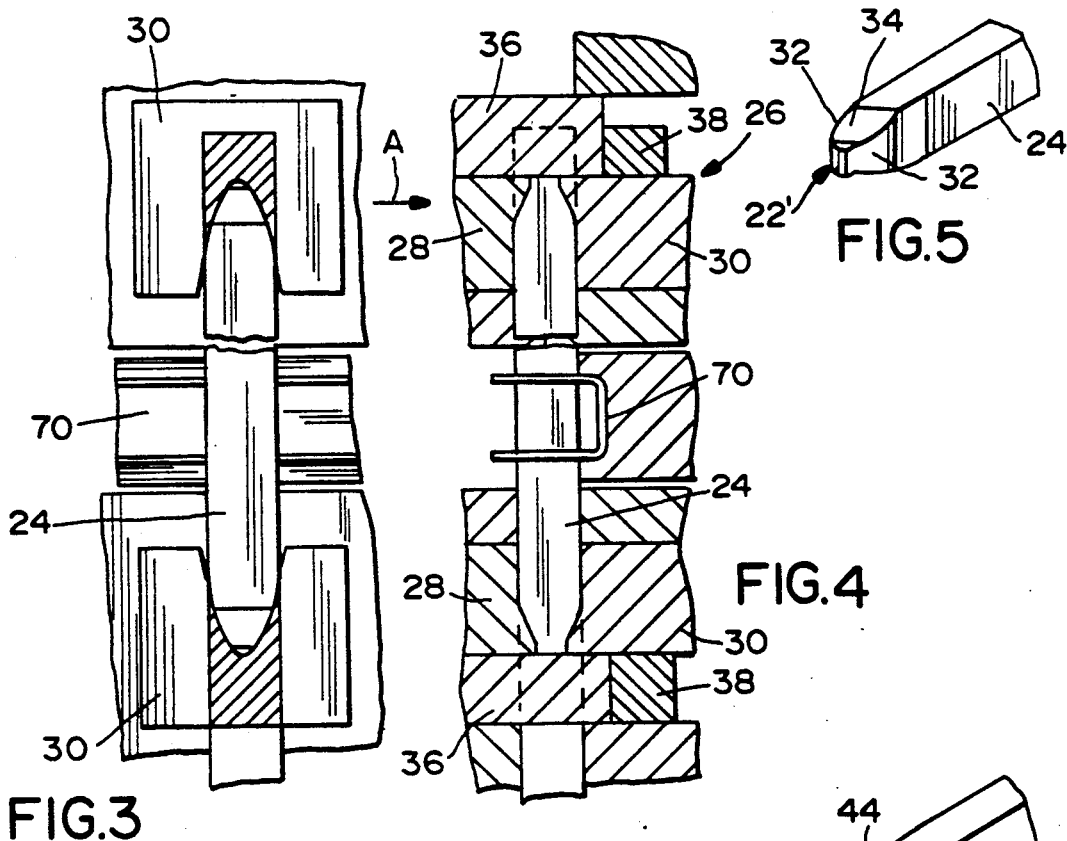
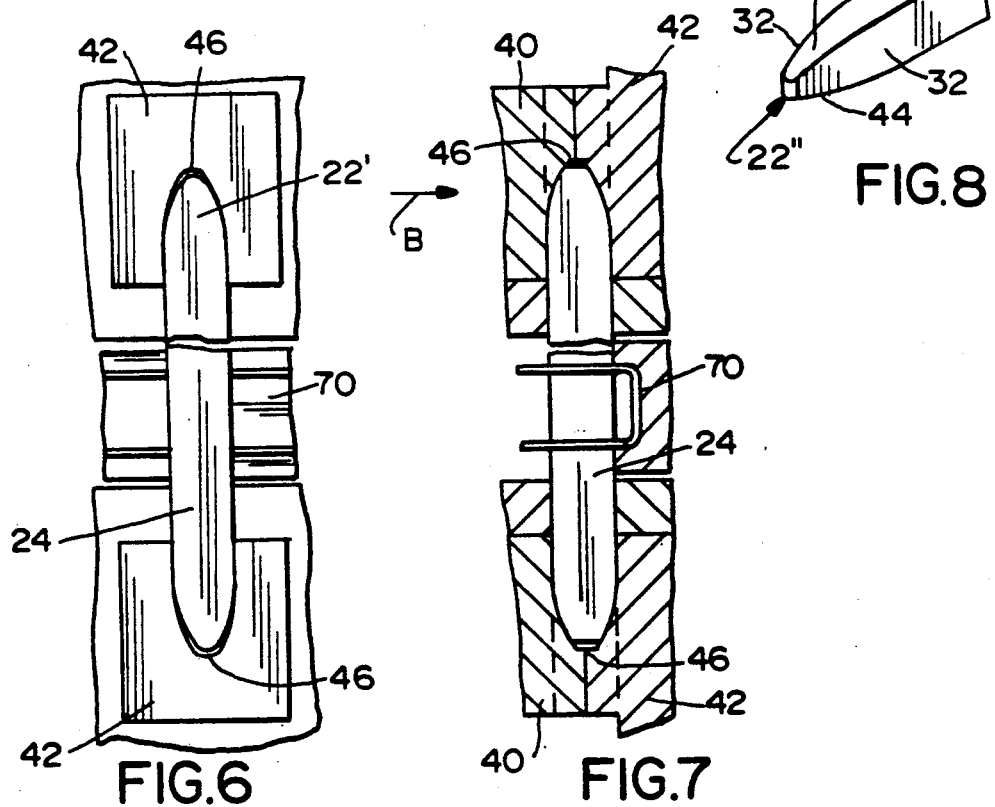

ELECTRICAL TERMINAL PIN

FIELD OF THE INVENTION

This invention generally relates to the art of electrical connectors and, particularly, to a terminal pin having an improved pin tip for insertion into an electrical female terminal, a plated-through hole in a printed circuit board or the like.

BACKGROUND OF THE INVENTION

It is well known in the electrical connector art to use terminal pins for interconnection with female terminals, for insertion into holes in printed circuit boards or for other applications as connector contact components. The pins may have rectangular/square or round cross-sections and typically are made with a pin core of an electrically conductive material which is plated with a conductive layer different from the core in order to reduce the cost of the pin and/or to provide a more rigid core than the more pliable conductive layer. In addition, the layer conventionally will not oxidize as much as the core. For instance, a pin core may be made of such materials as copper, brass, or suitable alloys, and the outer conductive layer may be made of such materials as gold, silver, tin, nickel, or a suitable alloy. Such terminal pins have been fabricated both by post-plating as well as by pre-plating the pin cores with the conductive layers. The terminals often are fabricated with pin tips having flat tapered sides to facilitate alignment with a mating female terminal and/or for insertion into a plated-through hole in a printed circuit board. Post-plated pins are relatively expensive because the post-plating procedure requires additional steps, time and material, and there is a tendency for the pins to be become bent or otherwise damaged during the additional handling for the post-plating processes.

Pre-plated pins which are swaged or coined to produce the flat tapered sides of the pin tips result in sharp edges which may cut into a mating female terminal or in a plated-through hole in a printed circuit board. Also these pins may not have a sufficient amount of plating on the pin tip to prevent corrosion build up.

Still other such terminal pins are fabricated in an in-line process where the output includes a line of pins connected tip-to-tip. The adjacent tips are severed to form individual terminal pins, but the severing creates a substantially flat non-plated tip surface which also may form sharp edges. Like the sharp corners of the flat side edges of the pin tips, the sharp end edges may have to be removed by still additional fabricating steps or processes.

While most terminal pins heretofore available and as described above have performed satisfactorily for their intended purposes of electrical conduction in various electrical connectors, there still is a need for a relatively inexpensive terminal pin which solves the problems identified above, particularly the problems created by sharp edges on the pin tips of the terminal pins.

SUMMARY OF THE INVENTION

An object, therefore, of the invention is to provide an electrical terminal pin with an improved pin tip for insertion into an electrical female terminal, a plated-through hole in a printed circuit board or the like.

In the exemplary embodiment of the invention, the terminal pin has an electrically conductive core which is plated with an electrically conductive layer. The terminal pin has a pin tip of a generally rounded pyramidal configuration defining four slightly curved convex sides thereof joined at four edges converging at a pin end. Generally, the invention contemplates that two opposite sides of the pin tip are non-plated, and the other two opposite sides of the pin tip are plated with the conductive layer. The conductive plating layer overlaps the edges of the pin tip in a smooth or rounded configuration to eliminate any sharpness thereof. The conductive layer also may at least partially overlap the pin end in a smooth or rounded configuration to eliminate any sharpness thereof and to provide protection to some of the exposed core material.

As disclosed herein, overlapping the edges of the pin tip by the conductive layer on two opposite sides of the pin tip is effected by a coining or swaging process. In essence, the conductive layer is coined over the sharp edges of the coined terminal pin core to provide rounded or smooth surfaces which will engage a mating electrical female terminal, a plated-through hole in a printed circuit board or the like. The coined plated layer will also result in a greater area of protection provided by the plated material.

More particularly, a method or process for fabricating electrical terminal pins according to the invention is carried out by providing a terminal pin of a given length with an electrically conductive core. The core may be round or rectangular/square in cross-section, with the core, including a pin tip thereof, being plated with an electrically conductive layer. The novel pin tip of the invention may be formed on one or both ends of the terminal pin.

During fabrication, a series of cutting and coining operations are performed to form the pin tip of the invention. First, the pin tip is cut on two opposite sides and is coined on the other two opposite sides to provide the generally rectangular pyramidal configuration of the tip and resulting in the two opposite cut sides of the pin tip being non-plated and the other two opposite coined sides of the pin tip being plated with the conductive layer. This cutting and coining operation can be performed at a single processing station. The other two opposite joined sides of the pin tips (i.e. the two sides which still are plated) then are coined again in one or more coining steps at subsequent coining stations to cause the conductive core and the conductive plating layer over the core to overlap the edges of the pin tip in a smooth or rounded configuration to eliminate any sharpness resulting from the edges. The conductive layer may also be caused to at least partially overlap the pin tip end in a smooth or rounded configuration.

Other objects, features and advantages of the invention will be apparent from the following detailed description taken in connection with the accompanying drawings.

BRIEF DESCRIPTION OF THE DRAWINGS

The features of this invention which are believed to be novel are set forth with particularity in the appended claims. The invention, together with its objects and the advantages thereof, may be best understood by reference to the following description taken in conjunction with the accompanying drawings, in which like reference numerals identify like elements in the FIGS. and in which:

FIG. 3 is a somewhat schematic top plan view of a first cutting and coining station in the process of the invention;

FIG. 4 is a somewhat schematic side view of the cutting and coining station of FIG. 3;

FIG. 5 is a fragmented perspective view of the terminal pin tip after having been processed at the station of FIGS. 3 and 4;

FIG. 6 is a somewhat schematic top plan view of a subsequent coining station for processing the terminal pin tip;

FIG. 7 is a somewhat schematic side view of the coining station of FIG. 6;

FIG. 8 is a fragmented perspective view of the pin tip after having been processed at the station of FIGS. 6 and 7;

DETAILED DESCRIPTION OF THE PREFERRED EMBODIMENT

Figure 1:
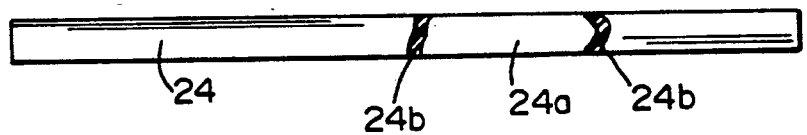
FIG. 1 is an elevational view of a terminal pin blank prior to having the pin tips thereof fabricated in accordance with the invention.
Figure 2:
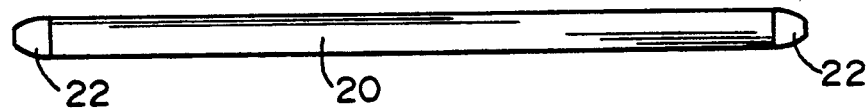
FIG. 2 is an elevational view of a terminal pin having the pin tips thereof fabricated according to the invention.

Referring to the drawings in greater detail, and first to FIGS. 1 and 2, the invention contemplates providing an electrical terminal pin 20 (FIG. 2) with a novel pin tip 22 at one or both ends of the terminal pin. The terminal pin is fabricated from a pin blank 24 (FIG. 1) which has a finite length. The blank may be rectangular/square in cross-section. The invention is illustrated herein with the blank being generally square. The blank originally is provided as a pre-plated component with a core 24a of an electrically conductive material, such as copper, brass or a suitable alloy. The core is plated or coated with a conductive layer (24b) such as of gold, silver, tin, nickel or a suitable alloy.

Terminal pin 20 may be used in a variety of electrical connector applications. For instance, a plurality of such pins may be used in a header connector whereby one pin tip 22 is mateable with an electrical female terminal of a complementary mating connector, and the opposite pin tip 22 may be inserted into a hole in a printed circuit board for interconnection with a circuit trace on the board or in a plated-through hole in the board.

FIGS. 4–11 represent somewhat schematically the steps or processing stations for fabricating pin tips 22 of terminal pin 20. These figures show fabrication of a terminal pin with pin tips of the invention at both opposite ends of the pin. However, it is contemplated that the pin tip of the invention may be formed at only one end of the terminal pin for any given application. Consequently, some of the following description may be directed in a singular sense, i.e. describing operations at only one end of the terminal pin.

More particularly, FIGS. 3 and 4 illustrate a somewhat schematic representation of a cutting and coining station for carrying out the first step in the process of forming pin tips 22. In particular, a terminal pin blank 24 (FIG. is fed to the cutting and coining station wherein each opposite end of the blank is positioned within a cutting and coining punch and die assembly, generally designated 26. Although the mechanics of such punches and dies are readily understandable to a tool and die maker skilled in the art, the results of the operations are shown by the partially formed pin tip, generally designated 22' in FIG. 5.

A coin punch 28 (FIG. 4) is moved in the direction of arrow A against a cutting and coining die 30 which is shaped and is effective to cut partially formed pin tip 22' with two opposite sides 32 (FIG. 5) which result in non-plated side surfaces. The movement of the coin punch 28 towards the cutting and coining die 30 also is effective to coin the other two opposite sides 34 of partially formed pin tip 22', as shown in FIG. 5, with the opposite coined sides 34 still being plated with the conductive layer of terminal pin blank 24. Another cutting punch 36 (FIG. 4) is effective to shear off a distal end of the terminal pin blank, resulting in a scrap portion 38 being discarded. The cutting side 32 of the pin tip could be performed at one station, and the coining of sides 34 of the pin tip could be performed at a separate other station using separate punch and die pairs. However, performing both operations at a single station with one punch and die pair as represented by FIGS. 3 and 4 is preferred.

At this point, it should be understood that describing pin tips 22 as being of a generally rectangular pyramidal configuration herein and in the claims hereof is meant to be in a general description context to clearly define the invention, with the pin having pairs of opposite sides. However, in actual practice, it can be seen in FIGS. 4–11 that the sides of the pin tips, such as unplated sides 32 described above, in relation to FIGS. 3–5, are slightly rounded.

Referring now to FIGS. 6–8, the next step in the process of the invention is to feed the coined and cut terminal pin blank 24 from the first station to a subsequent coining station schematically illustrated in FIGS. 6 and 7. At this station, a coining punch 40 is driven in the direction of arrow B against a coining die 42 to form a further or partially coined terminal tip 22" (FIG. 8). When so formed, opposite sides 32 of pin tip 22' still remain unplated, while the other two opposite sides, now designated 44 in FIG. 8, have been coined further to a more uniform and smooth curved configuration. It should be noted in FIG. 6 that a space 46 is provided in the cavity of coining die 42 to allow portions of the inner core to be coined or swaged and the conductive layer on opposite sides 44 to be coined or swaged outwardly beyond the conductive inner core of the terminal blank. The outward flow of the conductive layer is possible due to the characteristic of the outer conductive layer being made of a softer metal than that inner conductive core. Actually, FIG. 6 shows the parameters of cut and partially coined pin tip 22' (FIG. 5) prior to being coined to the configuration of pin tip 22" (FIG. 8). After the coining operation at the station represented by FIGS. 6 and 7, the pin tip 22" will completely fill this spacing.

Figures 9, 10:
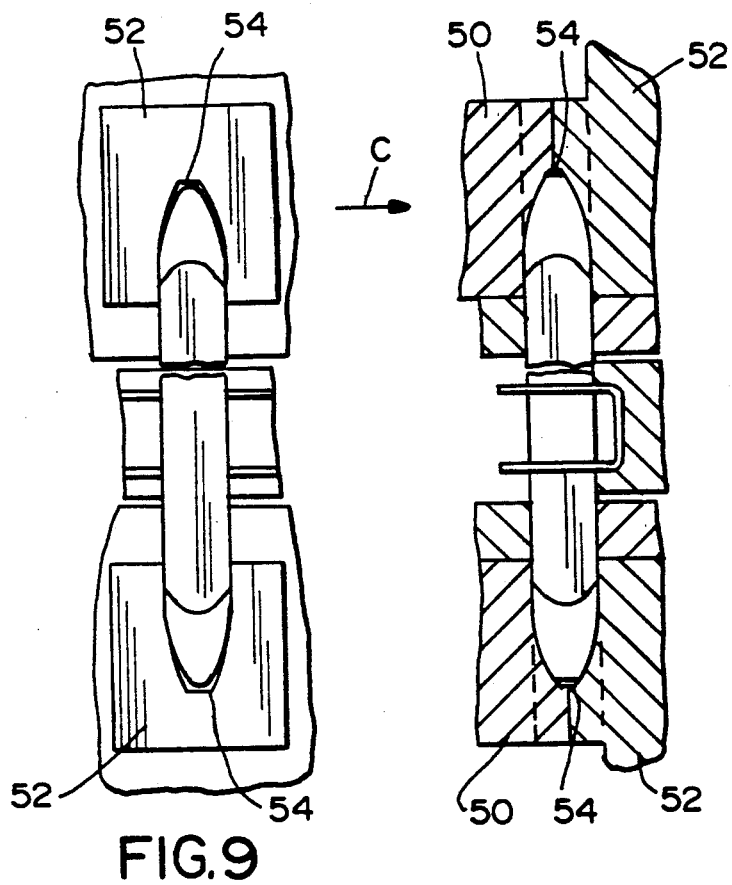
FIG. 9 is a somewhat schematic top plan view of a final coining station in the process of the invention.
FIG. 10 is a somewhat schematic side view of the coining station of FIG. 9.

The coined and cut pin blank from the second station is then fed to a final coining station schematically illustrated in FIGS. 9 and 10, whereat a final coining punch 50 is moved in the direction of arrow C against a final coining die 52 to form pin tip 22 of terminal pin 20 into its final configuration. As represented in FIG. 9, another spacing 54 is provided in the cavity of coining die 52 to allow om for portions of the inner core to be coined or swaged and the conductive layer of the pin tip to be further coined or swaged about the side edges of the pin tip and at the very tip end to allow the conductive layer to be coined over the end edge of the terminal pin core which resulted from the cutting operation of cutting punch 36 in the first station represented in FIG. 4.

Figure 11:
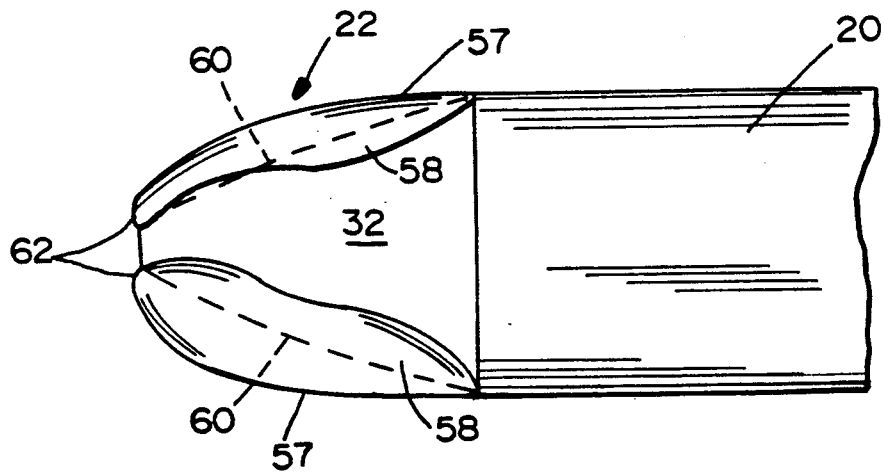
FIG. 11 is a fragmented perspective view of the final pin tip configuration of the invention after having been processed at the final coining station of FIGS. 9 and 10.

Referring to FIG. 11, in somewhat detail, pin tip 22 of terminal pin 20, resulting from the processing of the invention, has a configuration wherein the two opposite sides 32 of the pin tip still remain unplated as a result of the original cutting operation performed at the initial cutting and coining station represented by FIGS. 3 and 4. However, it can be seen that the conductive layer which coats the opposite two sides, now designated 57, of the terminal pin has been coined or swaged, as at 58, to overlap or cover the sharp edges remaining after the coining of the pin tip inner core, as represented by dotted lines 60. The overlapping portions 58 of the conductive layer provide a smooth or rounded configuration over the previously coined inner core sharp edges to eliminate any sharpness thereof. In addition, the conductive layer is coined, as at 62, to overlap or cover the previously sharp edges at the pin end to provide a smooth or rounded configuration which eliminates any sharpness at the end of the pin tip also.

Figure 13:
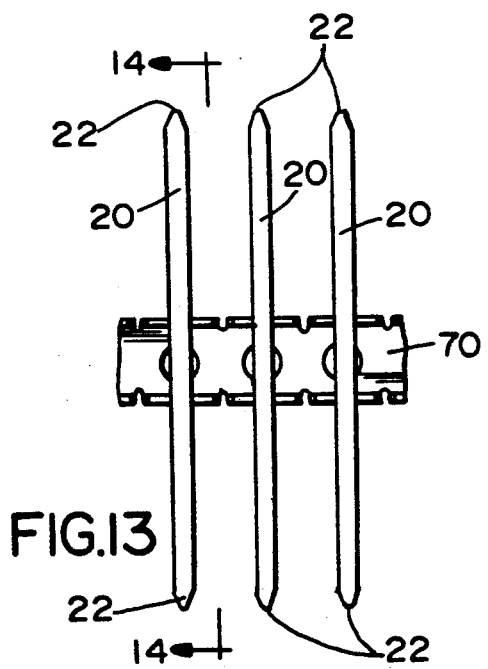
FIG. 13 is a fragmented top plan view of a plurality of terminal pins as being carried through the process.
Figures 12, 14:
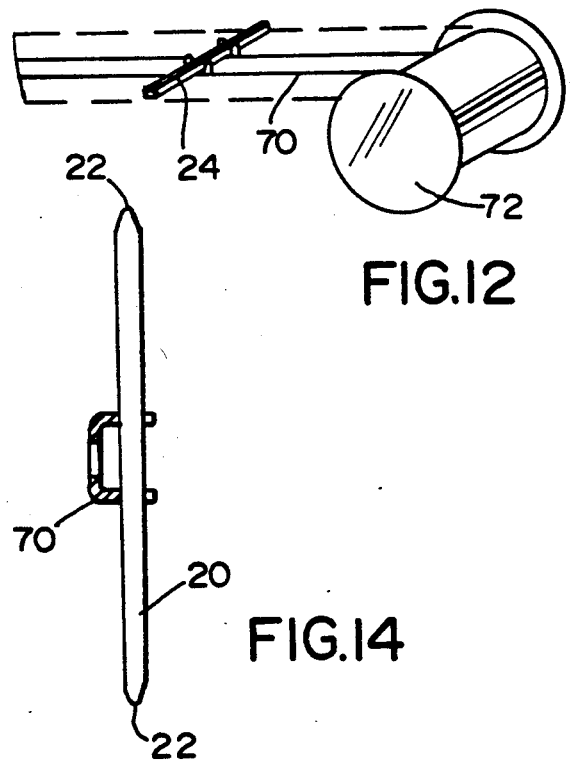
FIG. 12 is a somewhat schematic illustration of how one of the terminal pin blanks of FIG. 1 is carried through the various cutting and coining stations from a reel thereof.
FIG. 14 is a section taken generally along line 14—14 of FIG. 13.

FIGS. 12-14 simply show a schematic illustration of how terminal pin blanks 24 (FIG. 12) are fed through the various processing stations described above, by means of a bandolier strip 70, off of a reel 72. FIGS. 13 and 14 show a plurality of terminal pins 20 having been formed by the process of the invention and still engaged seriatim on the bandolier strip. The terminal blanks and the terminal pins are held on the strip by a press fit within spaced notches 4 in the strip. Therefore, the terminal blanks are fed seriatim through the processing stations of FIGS. 3-10 as shown therein.

It will be understood that the invention may be embodied in other specific forms without separating from the spirit or central characteristics thereof. The present examples and embodiments, therefore, are to be considered in all respects as illustrative and not restrictive, and the invention is not to be limited to he details given herein.

We claim:

1. In an electrical terminal pin having a pin tip for insertion into a mating electrical female terminal, a hole in a printed circuit board or the like, wherein the pin has an electrically conductive core of a generally rectangular configuration, the core being plated with an electrically conductive layer on four sides thereof, and the pin tip being of a generally rounded pyramidal configuration defining four sightly curved convex sides thereof joined at four edges converging at a pin end, wherein the improvement comprises two opposite sides of the pin tip being non-plated and the other two opposite sides of the pin tip being plated with said conductive layer, portions of the conductive layer overlapping the edges of the pin tip of a smooth configuration to eliminate any sharpness thereof.

2. In an electrical terminal pin as set forth in claim 1, wherein portions of the conductive layer at least partially overlaps the pin end in a smooth configuration to eliminate any sharpness thereof.

3. In an electrical terminal pin as set forth in claim 2, wherein said portions of the conductive layer which at least partially overlaps the pin end comprises coined material of the conductive layer.

4. In an electrical terminal pin as set forth in claim 1, wherein said portions of the conductive layer overlapping the edges of the pin tip comprises coined material of the conductive layer.

* * * * *